United States Patent
Yu

(10) Patent No.: US 7,369,001 B2
(45) Date of Patent: May 6, 2008

(54) FREQUENCY SYNTHESIZER HAVING VARIABLE FREQUENCY RESOLUTION, AND FRACTIONAL-N FREQUENCY SYNTHESIZING METHOD USING SIGMA-DELTA MODULATION OF FREQUENCY CONTROL PULSES

(75) Inventor: Hwa-Yeal Yu, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 144 days.

(21) Appl. No.: 11/177,131

(22) Filed: Jul. 8, 2005

(65) Prior Publication Data
US 2006/0181446 A1 Aug. 17, 2006

(30) Foreign Application Priority Data
Feb. 14, 2005 (KR) .................. 10-2005-0012014

(51) Int. Cl.
*H03L 7/193* (2006.01)
*H03M 3/00* (2006.01)
(52) U.S. Cl. .................. 331/16; 327/157; 341/143
(58) Field of Classification Search .................. 331/16; 327/157; 341/143
See application file for complete search history.

(56) References Cited

U.S. PATENT DOCUMENTS

| 5,880,642 | A | 3/1999 | Martinez |
| 7,012,471 | B2 * | 3/2006 | Lyden et al. .................. 331/16 |

FOREIGN PATENT DOCUMENTS

| JP | 9148885 | 6/1997 |
| JP | 2001237709 | 8/2001 |
| KR | 2002-28418 | 4/2002 |
| KR | 1020040105443 | 12/2004 |

* cited by examiner

*Primary Examiner*—Robert Pascal
*Assistant Examiner*—James Goodley
(74) *Attorney, Agent, or Firm*—F. Chau & Assoc., LLC

(57) ABSTRACT

A fractional-N frequency synthesizer supporting multi-band operation, having variable frequency resolution obtained by sigma-delta modulating a multi-bit frequency resolution control signal having at least one pulse, the at least one pulse having a period of P and a variable duty cycle. Frequency resolution can be increased by changing the duty cycle and without increasing input bits to the sigma-delta modulator. Thus, a core size of the sigma-delta modulator may be reduced.

20 Claims, 9 Drawing Sheets

FREQUENCY SYNTHESIZER HAVING VARIABLE FREQUENCY RESOLUTION, AND FRACTIONAL-N FREQUENCY SYNTHESIZING METHOD USING SIGMA-DELTA MODULATION OF FREQUENCY CONTROL PULSES

CROSS REFERENCE TO RELATED APPLICATION

This application claims priority under 35 USC § 119 to Korean Patent Application No. 2005-12014 filed on Feb. 14, 2005 in the Korean Intellectual Property Office (KIPO), the entire contents of which are hereby incorporated by reference.

BACKGROUND OF THE INVENTION

1. Field of the Invention

The present invention relates to a frequency synthesizer for synthesizing radio frequency signals, and more specifically to a fractional-N frequency synthesizer having a sigma-delta modulator that can enhance a frequency resolution of the output frequency of the frequency synthesizer without increasing input bits of the sigma-delta modulator.

2. Description of the Related Art

The demand for wireless real time multimedia data services is increasing. Consumers want high speed internet access via mobile devices, and also desire to upload or download multimedia data via mobile devices.

CDMA (Code Division Multiple Access) 2000 can provide high speed data service at 144 kbps which is used in the CDMA/PCS (Personal Communication System). Frequency synthesizers are an essential part of any modern communication system. Frequency synthesizers generate clock and oscillator signals needed for up and down conversion. Today's communication standards demand both high frequency accuracy and fast frequency settling.

Frequency synthesizers used in high speed data communications generally must satisfy setting time less than 500 μs, 10 KHz of frequency resolution, and phase noise less than −135 dBc/Hz at 1 MHz offset frequency. To satisfy a setting time of less than 500 μs, in a frequency synthesizer, the loop bandwidth of a PLL (Phase-Locked Loop) must be at least 10 KHz.

Generally, a mobile communication system such as CDMA or PCS employs an integer-N frequency synthesizer, for generating output frequencies that are integer multiples of a reference frequency. The integer-N frequency synthesizer has structural limitation in that the channel bandwidth of the integer-N frequency synthesizer is the same as the reference frequency. The channel bandwidth of the frequency synthesizer is referred to as a "frequency resolution" for selecting an exact channel. In a mobile communication system such as CDMA/PCS that have relatively small channel bandwidths of 30 kHz/10 kHz, respectively, a loop bandwidth of the CDMA/PCS should be much less than 30 kHz/10 kHz, respectively. Thus, the integer-N frequency synthesizer is not alone sufficient in a mobile communication system that requires settling time less than several milliseconds.

Thus, the conventional mobile communication system such as CDMA or PCS employs not only the integer-N frequency synthesizer but also a fractional-N frequency synthesizer. The fractional-N frequency synthesizer employs a sigma-delta modulator. A sigma-delta modulated signal output by the sigma-delta modulator controls the instantaneous frequency division modulus of a phase-locked loop used in fractional-N frequency synthesis. The sigma-delta modulator should be designed to have a frequency resolution of several Hz because the sigma-delta modulator should satisfy channel frequency spacing of multi-band.

Conventionally, in order for the sigma-delta modulator to have a frequency resolution of fewer Hz, input bits of input signal of the sigma-delta modulator are increased, and thus hardware size of the sigma-delta modulator may be increased.

When the input bits of the conventional sigma-delta modulator are decreased (in order to decrease the hardware size of the sigma-delta modulator), the frequency resolution may be decreased (i.e. the spacing between channel frequencies may become wider), and the sigma-delta modulator will not satisfy channel frequency spacing of multi-band communication.

SUMMARY OF THE INVENTION

A sigma-delta modulator is configured to modulate a multi-bit frequency resolution control signal having at least one pulse, the at least one pulse having a period P and a variable duty cycle, generated using a pulse generator.

A fractional-N frequency synthesizer is also provided, the synthesizer uses the sigma-delta modulator and a pulse generator (e.g., pulse width modulation) to modify the frequency resolution (spacing) of the frequency synthesizer. The fractional-N frequency synthesizer satisfies channel frequency spacing of multi-band without increasing input bits of the sigma-delta modulator.

A fractional-N frequency synthesizing method is also provided where channel frequency spacing of multi-band may be achieved without increasing input bits of the sigma-delta modulator.

An exemplary embodiment provides, an apparatus including: a pulse generator configured to generate a multi-bit frequency resolution control signal having at least one pulse, the at least one pulse having a period P and a variable duty cycle, (P being a positive integer); and a sigma-delta modulator configured to generate a random digital code by modulating the frequency resolution control signal. A multi-band output frequency signal based on the random digital code may be generated that supports a multi-band.

In other exemplary embodiments, a frequency synthesizer includes: a sigma-delta modulator configured to generate a random digital code by modulating a multi-bit frequency resolution control signal having at least one pulse, the at least one pulse having a period of P and a variable duty cycle, (P being a positive integer); a frequency divider configured to divide a voltage controlled oscillating frequency signal based on the random digital code; a phase frequency detector configured to detect a phase difference and a frequency difference between a reference frequency signal and the divided voltage controlled oscillating frequency signal; a charge pump configured to pump charges corresponding to an output of the phase frequency detector; a loop filter configured to filter a low frequency component of an output of the charge pump; and a voltage controlled oscillator configured to generate the voltage controlled oscillating frequency signal based on an output of the loop filter. The voltage controlled oscillating frequency signal may be advantageously used as a multi-band output frequency signal that supports a multi-band.

Still another exemplary embodiment of the invention provides a fractional-N frequency synthesizing method including: generating a random digital code by sigma-delta modulating a multi-bit frequency resolution control signal having at least one pulse, the at least one pulse having a period of P and a variable duty cycle (P being a positive integer), The fractional-N frequency synthesizing method may further include: dividing a voltage controlled oscillating frequency signal based on the random digital code; detecting a phase difference and a frequency difference between a reference frequency signal and the divided voltage controlled oscillating frequency signal; charging (or pumping charges) corresponding to an output of the detecting step; filtering a low frequency component of an output of the charging (or pumping) step; and generating the voltage controlled oscillating frequency signal based on an output of the filtering step. A multi-band output frequency signal that supports a multi-band can be generated using the voltage controlled oscillating frequency signal.

BRIEF DESCRIPTION OF THE DRAWINGS

The above and other features of the present invention will become more apparent by describing in detail exemplary embodiments thereof with reference to the accompanying drawings, in which like numbers refer to like elements throughout the description of the figures, and.

DETAILED DESCRIPTION OF THE EXEMPLARY EMBODIMENTS

Figure 1:
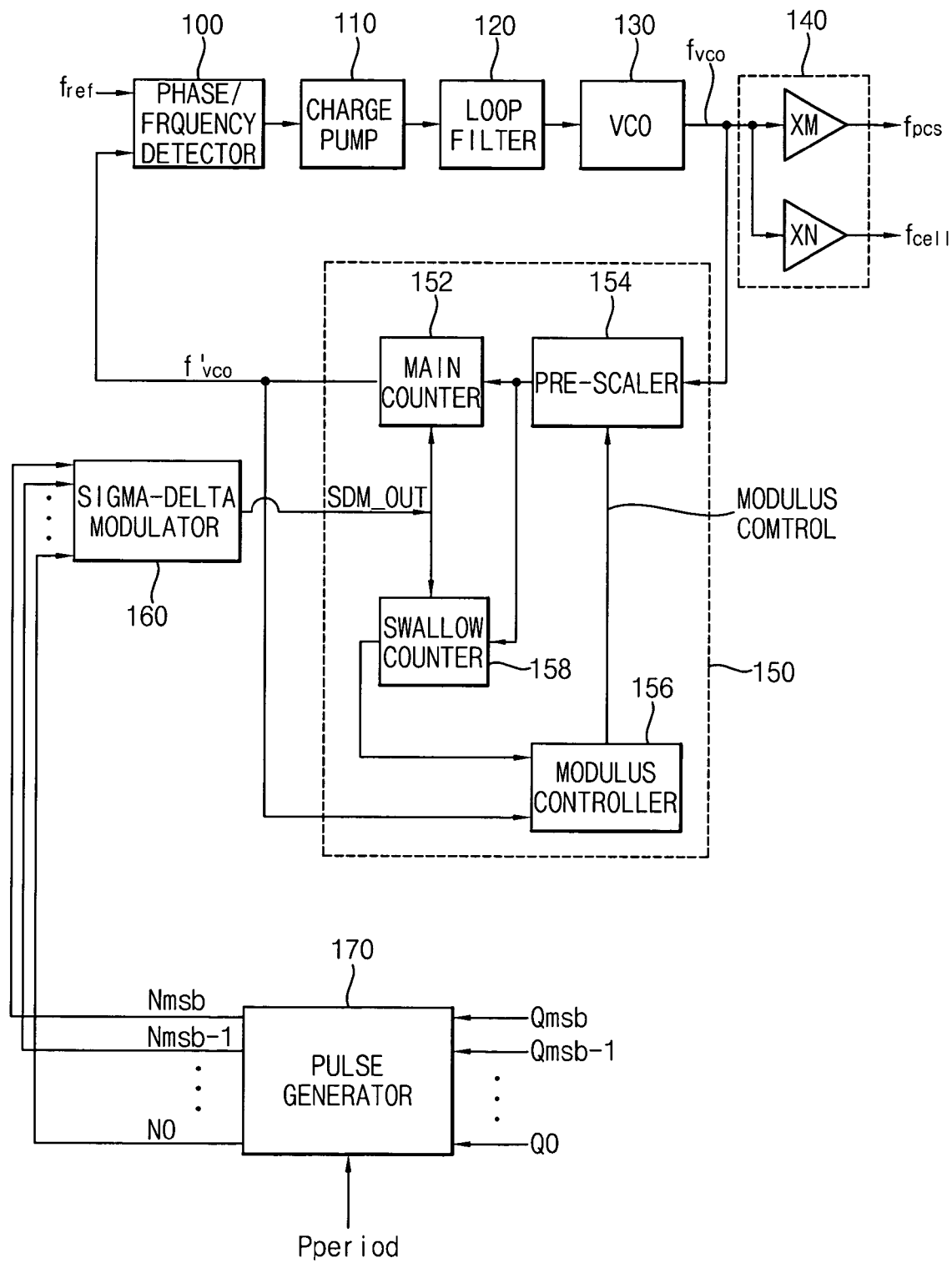
FIG. 1 is a block diagram showing a frequency synthesizer according to an exemplary embodiment of the present invention.

FIG. 1 is a block diagram showing a frequency synthesizer according to an exemplary embodiment of the present invention.

Referring to FIG. 1, the frequency synthesizer includes a phase frequency detector (PFD) 100, a charge pump 110, a loop filter 120, a voltage controlled oscillator (VCO) 130, a frequency multiplier 140, a frequency divider 150, a sigma-delta modulator 160 and a pulse generator 170.

The frequency synthesizer divides the frequency of a voltage controlled oscillating signal $f_{VCO}$ by a predetermined divisor N, detects the phase/frequency difference between the frequency divided voltage controlled oscillating signal $f'_{VCO}$ and the reference frequency signal fref, and generates a desired voltage controlled oscillating signal $f_{VCO}$ by causing the voltage controlled oscillating signal $f_{VCO}$ to change in frequency such that the phase error between the frequency divided voltage controlled oscillating signal $f'_{VCO}$ and the reference frequency signal fref is minimized.

The phase frequency detector (PFD) 100 detects phase/frequency differences between the frequency divided voltage controlled oscillating signal $f'_{VCO}$ and the reference frequency signal fref, and generates a pulse signal corresponding to the detected phase difference and the detected frequency difference.

The charge pump 110 charges (or pumps charges of) the pulse signal outputted by the phase frequency detector (PFD) 100.

The loop filter 120 filters low frequency component(s) of the output of the charge pump 110, and outputs a voltage signal (corresponding to filtered DC charges outputted by the phase frequency detector 100) to the voltage controlled oscillator 130.

The voltage controlled oscillator 130 generates the voltage controlled oscillating frequency signal ($f_{VCO}$) corresponding to the voltage signal outputted by the loop filter 120.

The sigma-delta modulator 160 performs sigma-delta modulation based on the frequency resolution control signal having multi-bits (Nmsb, Nmsb−1, . . . , N0) outputted from the pulse generator 170, and based on a plurality of predetermined feedback coefficients bi (see FIG. 2), and generates random digital code SDM_OUT that corresponds to a fractional part of the divisor N.

The frequency divider 150 generates and varies a main count value and a swallow count value based on the SDM_OUT signal, and performs modulus control using the varied main count value and the varied swallow count value. Thus, a fractional part of the divisor N and an integer part of the divisor N in the voltage controlled oscillating signal $f_{VCO}$ are determined by the modulus control procedure performed by the frequency divider 150.

The modulus controller 156 generates a modulus control signal for selecting one of divisors D or D+1 of the pre-scaler 154 in response to the main count value of the main counter 152 and the swallow count value of the swallow counter 158.

The pre-scaler 154 selects one of the divisors D or D+1 in response to the modulus control signal, and divides the frequency of the voltage controlled oscillating frequency signal ($f_{VCO}$) by the selected divisor D or D+1. For example, the pre-scaler 154 selects the divisor D+1 when the modulus control signal has a high level, and selects the divisor D when the modulus control signal has a low level.

The main counter 152 and the swallow counter 158 perform count operations in response to the selected divisor D or D+1 based on the SDM_OUT signal generated from the sigma-delta modulator 160. For example, the main counter 152 and the swallow counter 158 are programmable counters, and have predetermined initial integer part of a divisor, and perform down-counting operations by down-counting from the initial integer part of the divisor in response to the selected divisor D or D+1.

Generally, since the main count value is larger than the swallow count value, the swallow count value reaches zero earlier than the main count value reaches zero, and the swallow counter 158 stops the down-counting operation when the swallow count value reaches zero. The initial integer part of the divisor is loaded into the swallow counter 158 and the main counter 152 when the main count value reaches zero, and the swallow counter 158 and the main counter 152 restart the down-counting operation. For example, the frequency of the voltage controlled oscillating frequency signal ($f_{VCO}$) is divided by the divisor D+1 until the swallow count value reaches zero, and then the frequency of the voltage controlled oscillating frequency signal ($f_{VCO}$) is divided by the divisor D until the main count value reaches zero after the swallow count value reaches zero.

The frequency multiplier 140 multiplies the voltage controlled oscillating frequency signal ($f_{VCO}$) outputted from the voltage controlled oscillator 130 by multiply factors to generate multi-band output frequency signal. The multi-band output frequency signal supports a multi-band. For example, the frequency multiplier 140 multiplies the voltage controlled oscillating frequency signal ($f_{VCO}$) by multiply factor M to generate a first output frequency signal ($f_{PCS}$), and multiplies the voltage controlled oscillating frequency signal ($f_{VCO}$) by multiply factor N to generate a second output frequency signal ($f_{cell}$).

The pulse generator 170 generates a frequency resolution control signal having multi-bits (Nmsb, Nmsb–1, . . . , and, N0) based on a received pulse width control signal (Qmsb, Qmsb–1, . . . , and, Q1) and a period control signal (Pperiod). The multi-bit frequency resolution control signal (Nmsb, Nmsb–1, . . . , N0) has at least one pulse. For example, the number of pulses of the multi-bit frequency resolution control signal (Nmsb, Nmsb–1, . . . , N0) can be the same as the number of the multi-bits (Nmsb, Nmsb–1, . . . , N0). A period of a pulse is P (P is a positive integer), and a pulse has a variable duty cycle. A pulse width of a pulse varies based on the pulse width control signal (Qmsb, Qmsb–1, . . . , and, Q1), and the period P varies based on the period control signal (FIG. 4, shows the exemplary pulse shape of N0, Nmsb–1, in a pulse train of the multi-bits (Nmsb, Nmsb–1, . . . , or N0) of the frequency resolution control signal.)

Each bit of the pulse width control signal (Qmsb, Qmsb–1, . . . , Q1) corresponds to each of the multi-bits (Nmsb, Nmsb–1, . . . , N0) of the frequency resolution control signal, and determines a pulse width of a pulse corresponding to each bit of the multi-bits (Nmsb, Nmsb–1, . . . , N0) of the frequency resolution control signal. For example, the most significant bit (Qmsb) of the pulse width control signal determines a pulse width of a pulse corresponding to the most significant bit (Nmsb) of the multi-bit frequency resolution control signal. The pulse width of the pulse corresponding to the most significant bit (Nmsb) of the multi-bit frequency resolution control signal may be varied by applying variable binary digital code to the Qmsb bit. For example, the if pulse width of the pulse corresponding to the Nmsb bit has a first value when '11111' is inputted to the Qmsb, then the pulse width of the pulse corresponding to the Nmsb bit has a second value different from the first value when '00000' is inputted to the Qmsb.

The frequency resolution of the output frequency signal (e.g., first output frequency signal ($f_{PCS}$)) may be varied depending upon a duty cycle (i.e. Q/P) of the periodic pulse train input to the sigma-delta modulator. The pulse width of the pulses may be varied by using various methods. For example, the pulse width of the pulses corresponding to all bits (Nmsb, Nmsb–1, . . . , N0) of the multi-bit frequency resolution control signal may be varied by applying variable binary digital code to one bit of the pulse width control signal. Alternatively, the pulse width of the pulses corresponding to some bits of the multi-bits (Nmsb, Nmsb–1, . . . , N0) of the frequency resolution control signal may be varied by applying variable binary digital code to one bit of the pulse width control signal. Alternatively, the pulse width of the pulses corresponding to all bits (Nmsb, Nmsb–1, . . . , N0) of the multi-bit frequency resolution control signal may be varied by applying variable binary digital code to B1 bits of the pulse width control signal, where B1 is less than the number of the bits (Nmsb, Nmsb–1, . . . , N0). Alternatively, the pulse width of the pulses corresponding to some bits of the multi-bits (Nmsb, Nmsb–1, . . . , N0) of the frequency resolution control signal may be varied by applying variable binary digital code to B1 bits of the pulse width control signal. The pulse width of the pulses corresponding to some bits (or all bits) of the multi-bits (Nmsb, Nmsb–1, . . . , N0) of the frequency resolution control signal may have the same value as each other or different values from each other.

The period control signal Pperiod can determine the period P of a pulse corresponding to each bit of the multi-bits (Nmsb, Nmsb–1, . . . , N0) of the frequency resolution control signal. The period control signal Pperiod can determine the period P of a pulse corresponding to all bits (Nmsb, Nmsb–1, . . . , N0) of the multi-bit frequency resolution control signal in the same manner as the pulse width control signal (Qmsb, Qmsb–1, . . . , Q1) determines the pulse width of a pulse corresponding to all bits (Nmsb, Nmsb–1, . . . , N0) of the multi-bit frequency resolution control signal. The period control signal Pperiod can determine the period P of a pulse corresponding to some bits of the multi-bits (Nmsb, Nmsb–1, . . . , N0) of the frequency resolution control signal in the same manner as the pulse width control signal can determine the pulse width of a pulse corresponding to some bits of the multi-bits (Nmsb, Nmsb–1, . . . , N0) of the frequency resolution control signal. The period P of the pulses corresponding to some bits (or all bits) of the multi-bits (Nmsb, Nmsb–1, . . . , N0) of the frequency resolution control signal may have the same value as each other or different values from each other.

Figure 2:
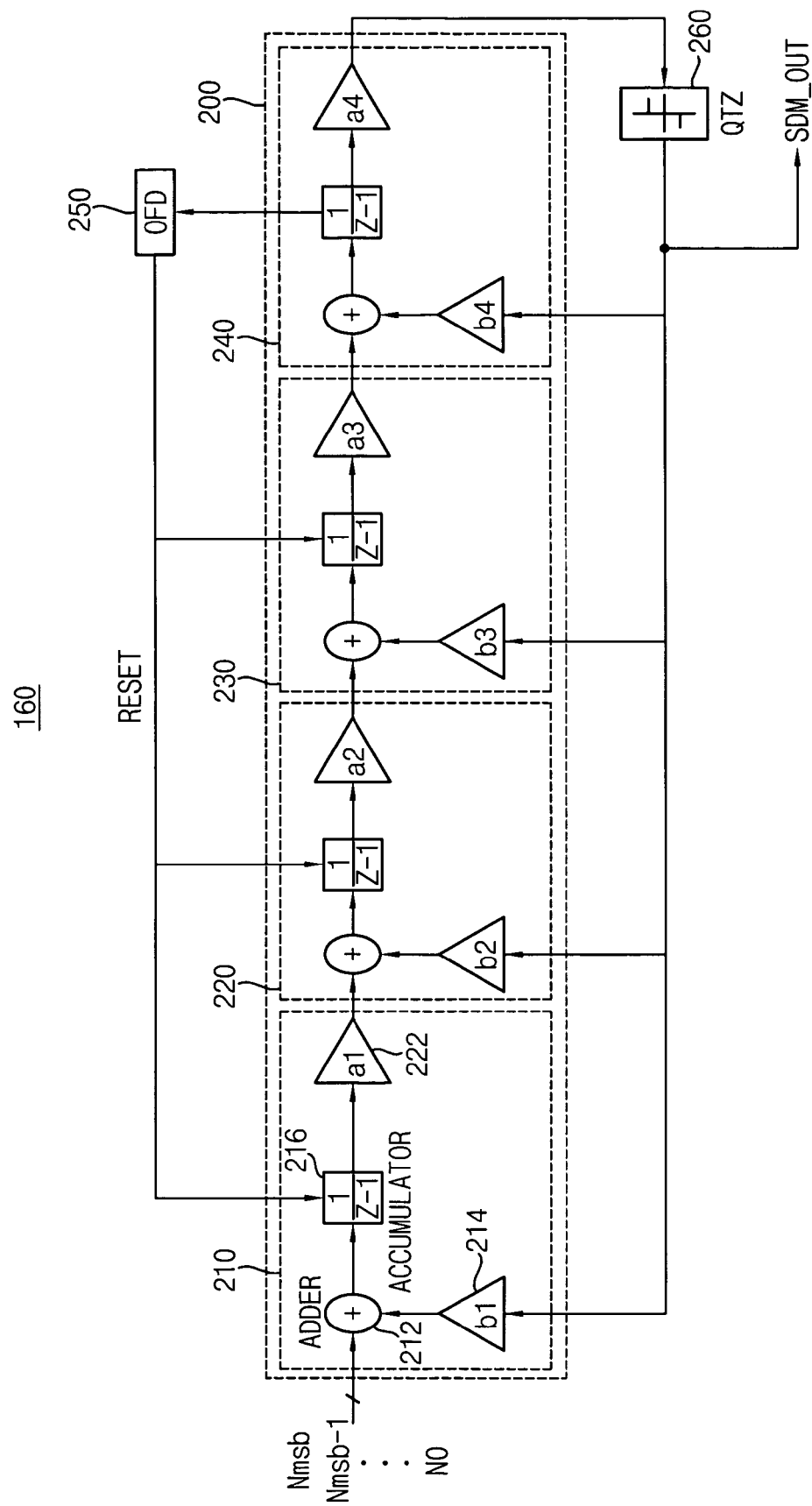
FIG. 2 is a block diagram showing a sigma-delta modulator of the frequency synthesizer of FIG. 1.

FIG. 2 is a block diagram showing a sigma-delta modulator of the frequency synthesizer of FIG. 1.

Referring to FIG. 2, the sigma-delta modulator includes a modulator 200, an overflow detector (OFD, 250) and a quantizer (QTZ, 260). For example, the modulator unit 200 includes first, second, third and fourth modulator stages 210, 220, 230 and 240. Each of the modulator stages 210, 220, 230 and 240 includes an adder 212, an accumulator 216, a feedback coefficient provider 214 and a weight provider 222.

The first, second, third and fourth modulator stages 210, 220, 230 and 240 perform sigma-delta modulations of the multi-bit frequency resolution control signal (Nmsb, Nmsb–1, . . . and, N0) using a plurality of feedback coefficients b1, b2, b3 and b4.

The overflow detector 250 detects an overflow of an output of the modulator 200 to reset the accumulator 216 of the each of the modulator stages 210, 220, 230 and 240.

The quantized output SDM_OUT from the quantizer QTZ 260 is positively fed back (or negatively fed back) to the feedback coefficient providers b1, b2, b3 and b4 in the modulator stages 210, 220, 230 and 240, respectively. The quantized output SDM_OUT (the random digital code) is based on the output of the last (fourth) modulator stage 240.

The SDM_OUT is added to a value predetermined by the frequency divider 150 and determines the divisor N that has a fractional part and an integer part.

The divisor N is represented in the expression 1.

$$fvco = \left(BP + A + \frac{k}{b_1 \cdot 0.25}\right) \cdot fref \qquad <\text{Expression 1}>$$

$f_{VCO}$ is obtained by multiplying $f_{ref}$ by N. (BP+A) represents an integer part of the divisor N and is determined by the main counter 152, the swallow counter 158 and the pre-scaler 154. k/(b1×0.25) represents a fractional part of the divisor N and is determined by the sigma-delta modulator 160. 0.25 of the fractional part represents a constant value when a 3-bit quantizer (QTZ) is used in the sigma-delta modulator 160. k represents a decimal number corresponding to the multi-bit frequency resolution control signal (Nmsb, Nmsb−1, . . . , N0).

An effective fractional part of the divisor N is represented by expression 2.

$$N_f = \frac{k}{0.25 \cdot b_1}\left(-\frac{b_1}{8} \le k \le \frac{b_1}{8}\right) \qquad <\text{Expression 2}>$$

A frequency resolution is represented by expression 3 based on expressions 1 and 2.

$$f_{resolution} = \frac{1}{0.25 \cdot b_1} \cdot f_{ref} \qquad <\text{Expression 3}>$$

The output frequency outputted from the fractional-N frequency synthesizer is shifted by a predetermined frequency Δf from a frequency corresponding to an output frequency divided by the integer part of the divisor N.

When SDM_input represents the multi-bit frequency resolution control signal (Nmsb, Nmsb−1, . . . , N0) inputted into the sigma-delta modulator 160, the predetermined frequency Δf is represented by expression 4.

SDM_imput= <Expression 4>

$(M_{MSB}, M_{MSB-1}, M_{MSB-2}, \ldots, M_2, M_1, M_0)$ $Mi =$ 1 or 0, $i = MSB \sim 0$ $$\Delta f = f_{ref} \cdot \left(\frac{\sum_{n=0}^{MSB} M_n \cdot 2^n}{0.25 \cdot b_1}\right) =$$

$$f_{ref} \cdot \left[\frac{(M_0 2^0 + M_1 2^1 + \cdots + M_{MSB} 2^{MSB})}{0.25 \cdot b_1}\right]$$

Figure 3A:
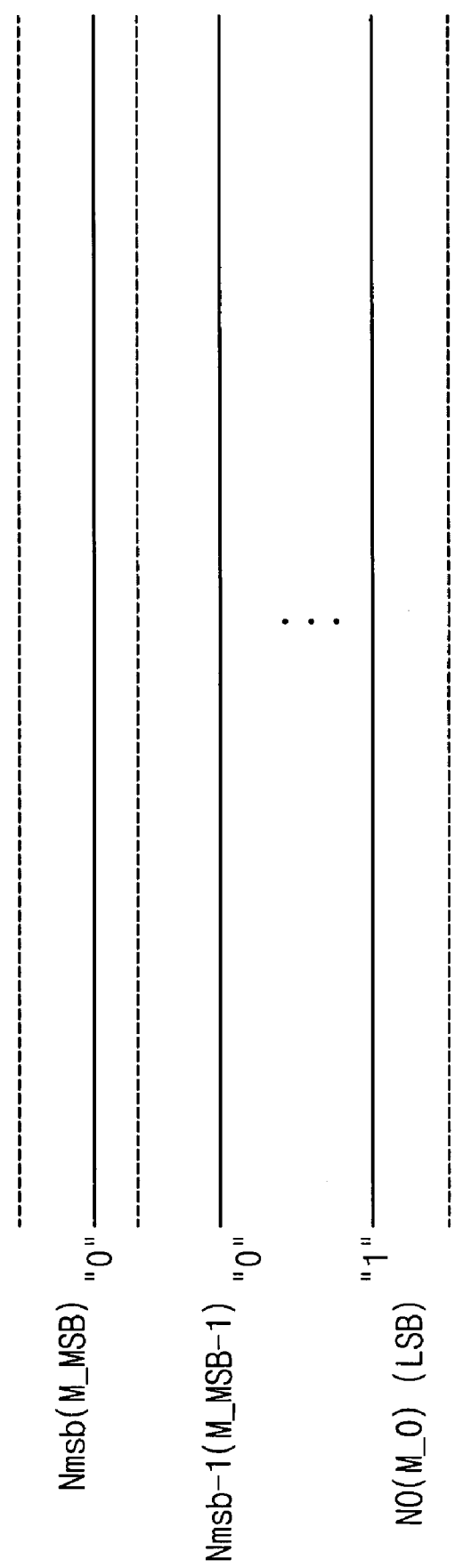
FIG. 3A is a timing diagram showing the steady states of the multi-bits (Nmsb, Nmsb−1, . . . , or N0) of a frequency resolution control signal input to the sigma-delta modulator of FIG. 2.
Figure 3B:
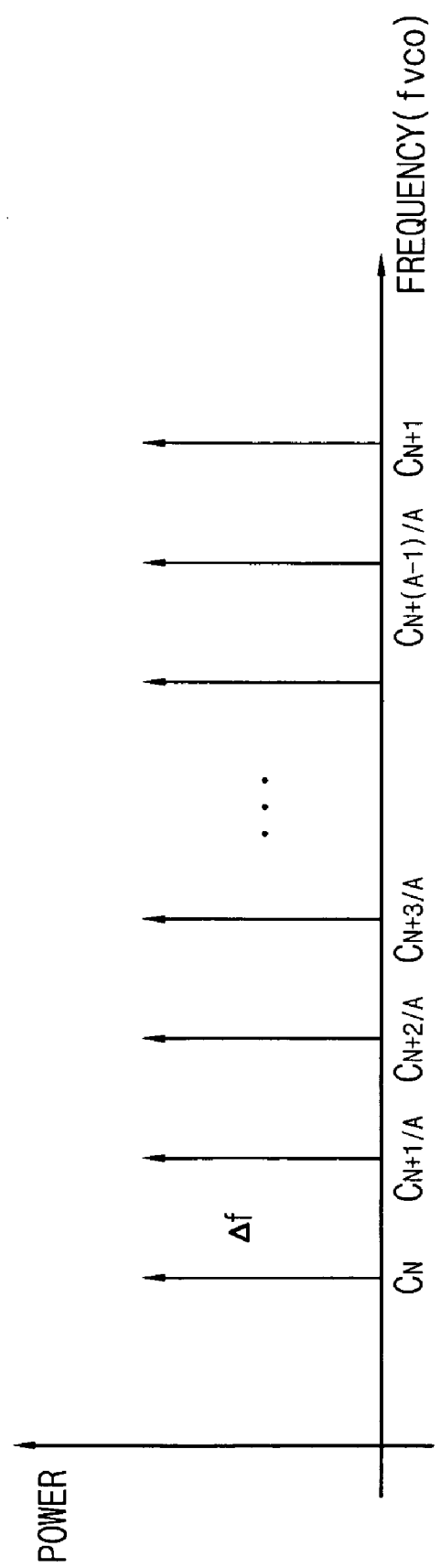
FIG. 3B is a graph showing the fractional-N frequency resolution resulting from the steady state multi-bit frequency resolution control signal of FIG. 3A.

FIG. 3A is a timing diagram showing the steady states of the multi-bits (Nmsb, Nmsb−1, . . . , or N0) of a frequency resolution control signal input to the sigma-delta modulator of FIG. 2. FIG. 3B is a graph showing the fractional-N frequency resolution resulting from the steady state multi-bit frequency resolution control signal of FIG. 3A.

Referring to FIG. 3B, frequencies $C_N$ and $C_{N+1}$ represents frequencies of the output frequency signal that is divided by an integer divisor (N, N+1). Frequency $C_{N+1/A}$ represents an output frequency shifted by a minimum frequency (fmin=Δf) from the frequency $C_N$ (when the least significant bit (LSB) M0 (or N0) has a binary value '1' and the other bits (M1, M2, . . . , Mmsb) have binary value '0'). Frequency $C_{N+2/A}$ represents an output frequency shifted by double the minimum frequency (2×fmin) from the frequency $C_N$ when the M1 (or N1) bit has a binary value '1' and the other bits (M0, M3, . . . , Mmsb) have binary value '0'. 'A' represents the input range of the sigma-delta modulator 160.

Each of Mn of expression 4 is replaced with Qn/Pn, so that expression 4 can be represented by expression 5. As indicated by expression 5, frequency resolution (Δf=$f_{resolution}$) may be regulated (e.g., increased) by changing the ratio Qn/Pn (e.g., without increasing input bits of the sigma-delta modulator).

$$\Delta f = f_{ref} \cdot \left(\frac{\sum_{n=0}^{MSB}\left(\frac{Q_n}{P_n}\right) \cdot 2^n}{0.25 \cdot b_1}\right) = \qquad <\text{Expression 5}>$$

$$f_{ref} \cdot \left[\frac{\left(\frac{Q_0}{P_0} \cdot 2^0 + \frac{Q_1}{P_1} \cdot 2^1 + \cdots + \frac{Q_{MSB}}{P_{MSB}} \cdot 2^{MSB}\right)}{0.25 \cdot b_1}\right]$$

Figure 4A:
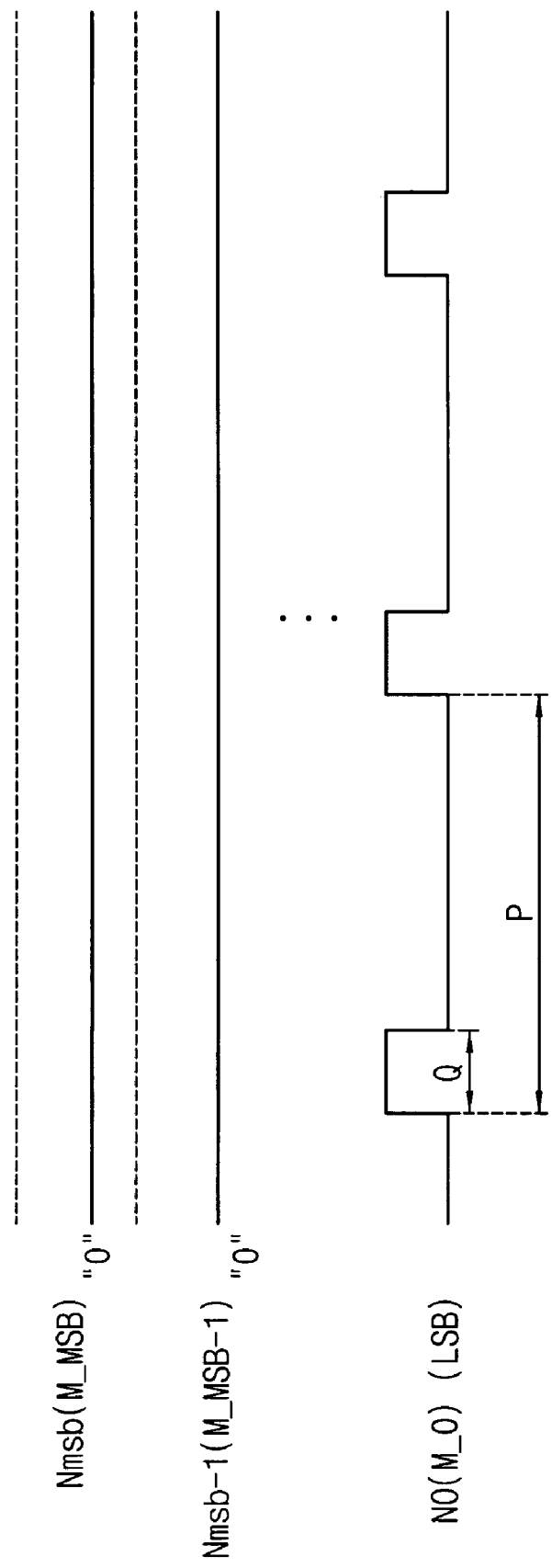
FIG. 4A is a timing diagram of a variable duty-cycle multi-bit frequency resolution control signal for varying of the fractional-N frequency resolution of an output frequency signal.

FIG. 4A is a timing diagram of a variable duty-cycle multi-bit frequency resolution control signal for varying the fractional-N frequency resolution of an output frequency signal (e.g., of first output frequency signal ($f_{PCS}$)).

Referring to FIG. 4A, the duty cycle Qn/Pn of expression 5 is depicted in a pulse of each bit of the multi-bits (Nmsb, Nmsb−1, . . . , or N0) of the frequency resolution control signal. P represents a period of a pulse, and Q represents a pulse width of a pulse. Specifically, since each bit of the multi-bits (Nmsb, Nmsb−1, . . . , or N0) of the frequency resolution control signal corresponds to a periodic pulse having a period P and a pulse width Q, the frequency resolution of the output frequency signal (e.g., of first output frequency signal ($f_{PCS}$)) may be varied by changing the duty cycle (i.e. Q/P) of the periodic pulse. An optimum period P may be determined by simulation based on properties of the sigma-delta modulator.

Figure 4B:
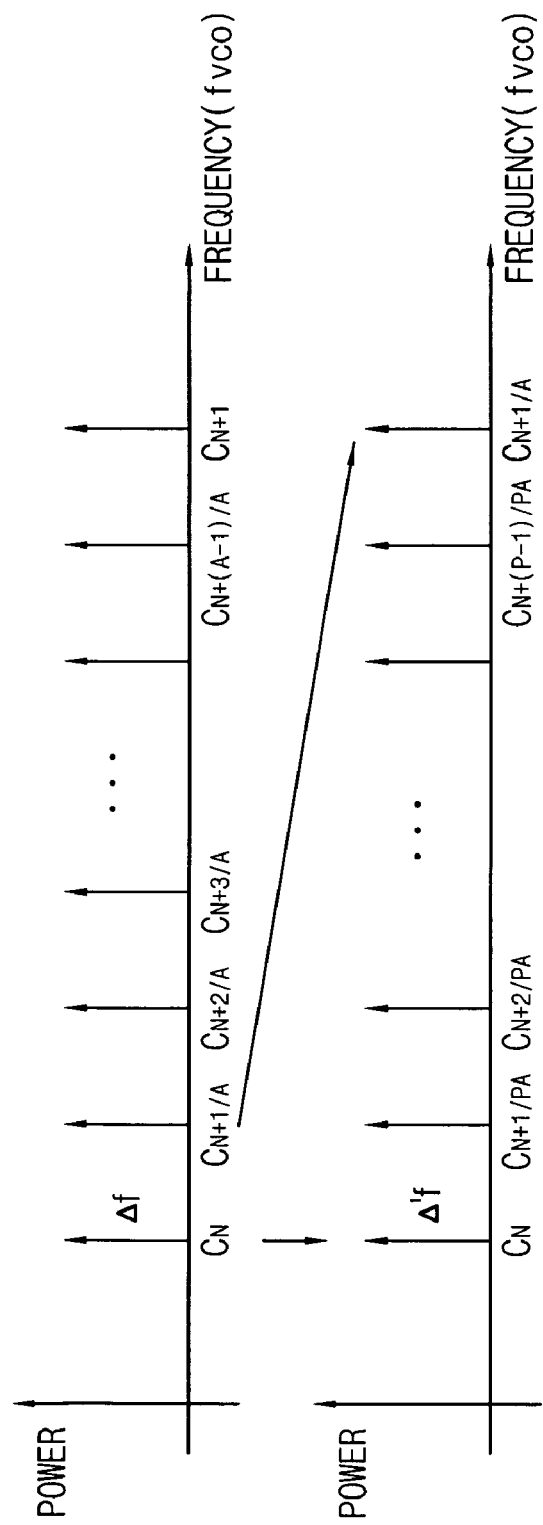
FIG. 4B is a graph showing the enhanced fractional-N frequency resolution resulting from using the variable duty-cycle multi-bit frequency resolution control signal of FIG. 4A.

FIG. 4B is a graph showing the enhanced fractional-N frequency resolution resulting from sigma-delta modulation of a variable duty-cycle multi-bit frequency resolution control signal of FIG. 4A. FIG. 4B shows the available frequencies of the output frequency signal when a period (e.g., P0 of N0) of a pulse corresponding to the LSB bit M0 (or N0) is P, and when a pulse width (e.g., Q0 of N0) of the pulse corresponding to the LSB bit M0 (or N0), is changed from a constant (e.g., P0=Q0 of N0) to a variable. The result is a plurality of available frequencies between $C_N$ and $C_{N+1/A}$. FIG. 4B is not drawn to the same frequency scale as FIG. 3B.

FIG. 3B shows the frequencies of the output frequency signal when the respective pulse corresponding to each bit of the multi-bits (Nmsb, Nmsb−1, . . . , or N0) of the frequency resolution control signal has a constant (DC) level. As shown in FIG. 4B, the frequency resolution of the output frequency signal of FIG. 4B is enhanced (or increased) by a variable period P as compared with the frequency resolution of the output frequency signal of FIG. 3B.

When the respective pulse corresponding to each bit of the multi-bits (Nmsb, Nmsb−1, . . . , or N0) of the frequency resolution control signal has a DC level (as shown e.g., FIG.

3A), an average of the random digital codes outputted from the sigma-delta modulator 160 corresponds to a fractional part of the divisor N by which the frequency synthesizer generates the frequencies $C_N$, $C_{N+1/A}$, $C_{N+2/A}$, ..., $C_{N+(A-1)/A}$, and $C_{N+1}$ of the output frequency signal. (as shown in FIG. 3B).

On the other hand, when the respective pulse corresponding to each bit of the multi-bits (Nmsb, Nmsb−1, ..., or N0) of the frequency resolution control signal is a periodic pulse having variable pulse width (or varying duty cycle), an average of the random digital codes outputted from the sigma-delta modulator 160 corresponds to a fractional part of the divisor N by which the frequency synthesizer has a finer frequency resolution, and can generate more frequencies $C_N$, $C_{N+1/PA}$, $C_{N+2/PA}$, $C_{N+(P-1)/A}$, and $C_{N+1/A}$ of the output frequency signal.

Thus, an average of the multi-bits corresponding to the pulses inputted to the sigma-delta modulator 160 corresponds to an average of the random digital codes.

Figure 5:
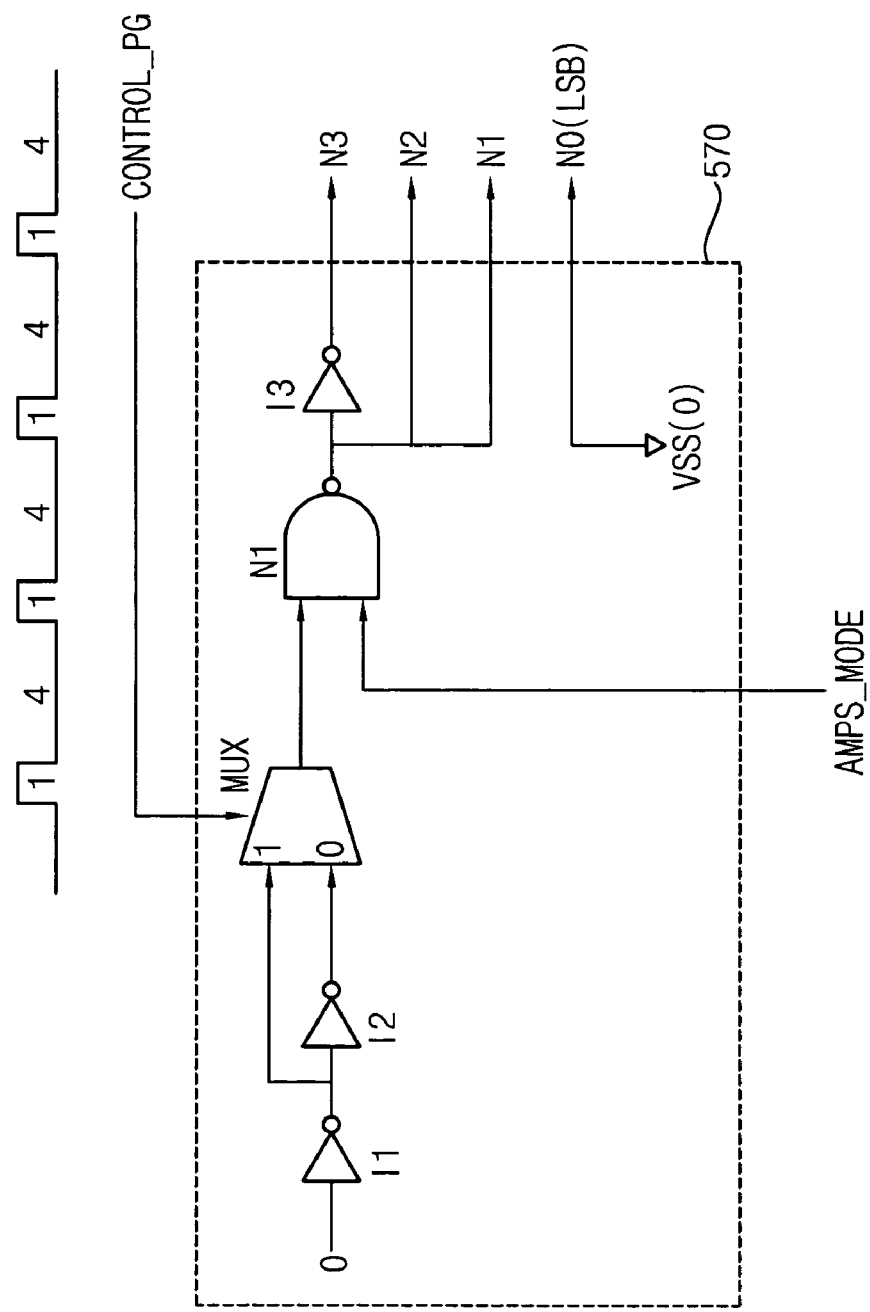
FIG. 5 is a circuit diagram showing a pulse generator according to an exemplary embodiment of the present invention.

FIG. 5 is a circuit diagram showing an exemplary pulse generator according to an exemplary embodiment of the present invention.

Referring to FIG. 5, the pulse generator 570 includes inverters I1, I2 and I3, multiplexer MUX and a NAND-gate N1.

The pulse generator 570 generates pulses corresponding to lower four bits N3, N2, N1 and N0 of the multi-bits (Nmsb, Nmsb−1, ..., and N0) of the frequency resolution control signal in response to the pulse generating control signal CONTROL_PG that controls the pulse width and the periods of the pulses corresponding to the lower four bits N3, N2, N1 and N0. In an exemplary embodiment, the pulse generator 570 may switch the frequency resolution from that needed for a cellular phone service to the a frequency resolution needed for AMPS (Advanced Mobile Phone System) mode service. For example, the pulse generator 570 can output the pulses corresponding to the lower four bits N3, N2, N1, and N0 to the sigma-delta modulator 160 only when the AMPS mode is activated.

Figure 6:
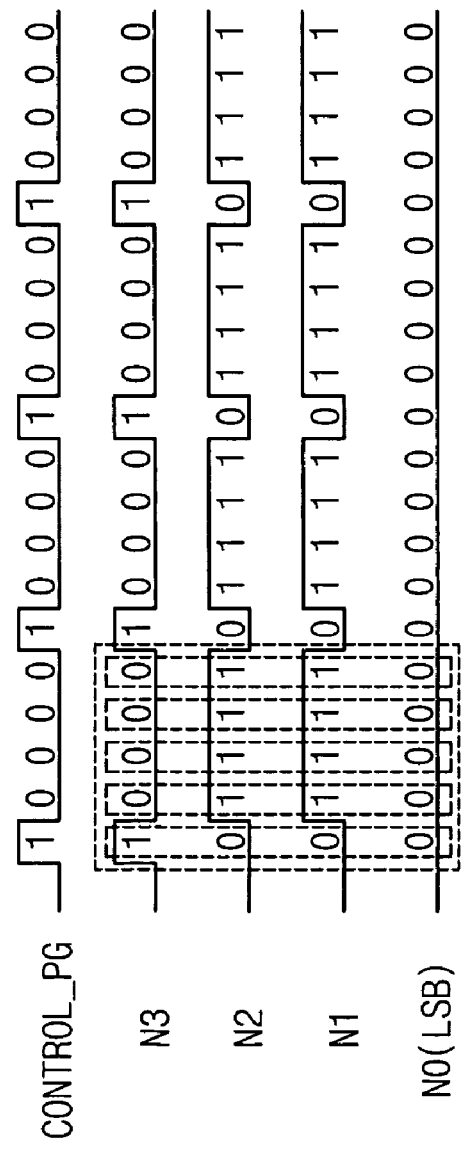
FIG. 6 is a diagram showing the synthesis of an output frequency signal generated by use of the pulse generator of FIG. 5.

FIG. 6 is a graph showing the variation of frequency resolution of output frequency signal generated by varying the output of the pulse generator of FIG. 5.

Referring to expression 3, the multi-bit frequency resolution control signal (Nmsb, Nmsb−1, ..., N0) has about 3.75 kHz (=3.84 MHz×1/(0.25×4096)) of frequency resolution at a 3.84 MHz reference frequency. It is possible to generate m×60 kHz as a result of frequency synthesis when the frequency synthesis adopts 16×3.75 kHz (=60 kHz) of frequency resolution. A local oscillating frequency of a local oscillator at 60 kHz×½ can be used as so as to support 30 kHz of cellular channel space.

In order to support the AMPS mode, a channel frequency of the AMPS mode is shifted by about 12 kHz from a channel frequency of the cellular mode. Thus, when ½×$f_{VCO}$ (the frequency outputted from the local voltage-controlled oscillator 130) is used as a local oscillating frequency, the voltage-controlled local oscillator 130 generates about 24 kHz (=12 kHz×2) frequency, the lower four bits N3, N2, N1 and N0 of the multi-bits (Nmsb, Nmsb−1, ..., and N0) of the frequency resolution control signal is varied as shown in FIG. 6, and thus the average of the output frequency is shifted by about 24 kHz.

Specifically, Referring to FIG. 6, '1000', '0110', '0110', '0110', '0110' are periodically inputted as pulses (as the lower four bits N3, N2, N1 and N0 of the multi-bits (Nmsb, Nmsb−1, ..., and N0)) of the frequency resolution control signal. An average of the multi-bits corresponding to the pulses inputted to the sigma-delta modulator 160 corresponds to an average of the output of the sigma-delta modulator 160.

Figure 7:
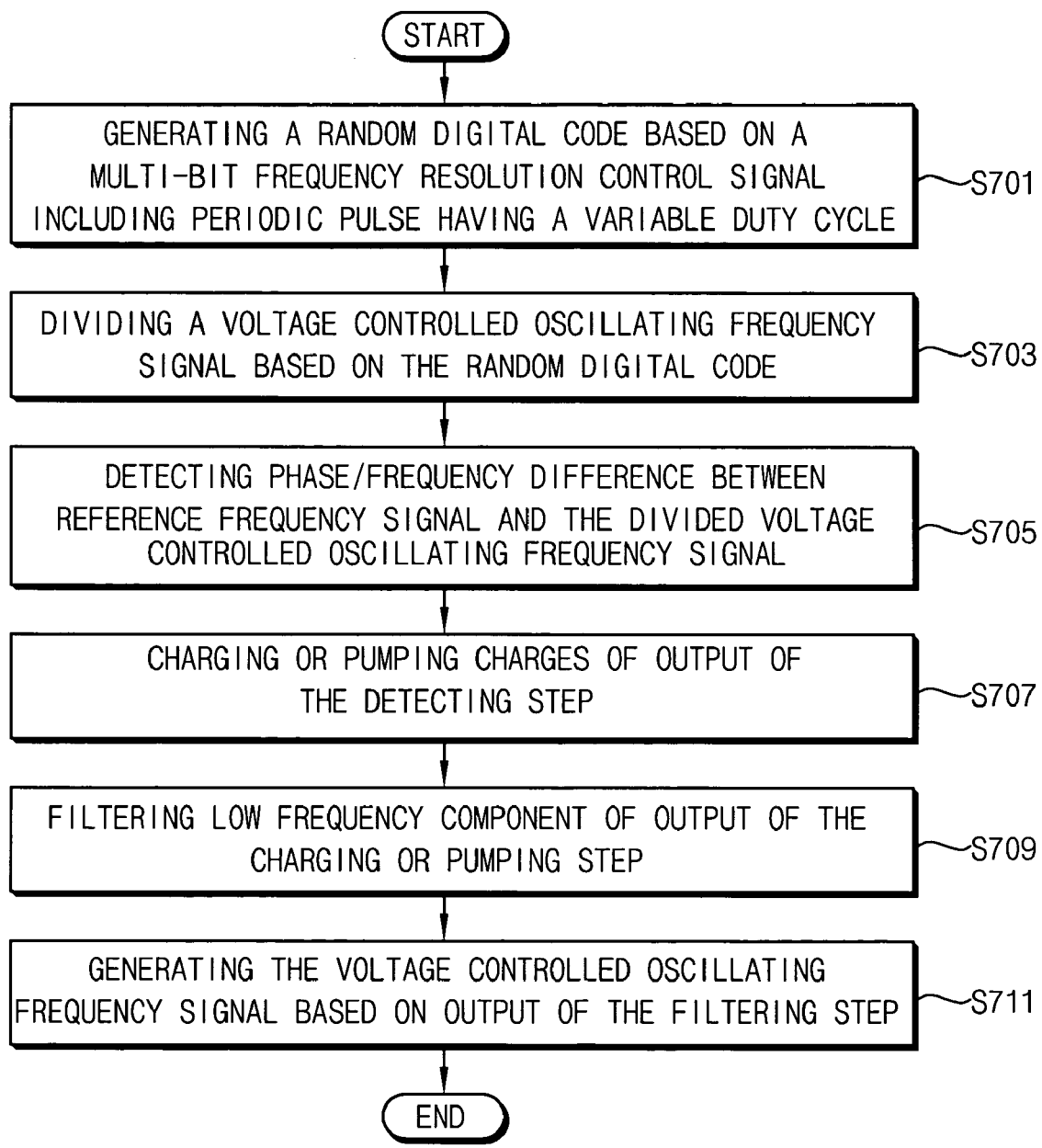
FIG. 7 is a flow chart showing a fractional-N frequency synthesizing method according to an exemplary embodiment of the present invention.

FIG. 7 is a flow chart showing a fractional-N frequency synthesizing method according to an exemplary embodiment of the present invention.

Referring to FIG. 7, in step S701, a random digital code (SDM_OUT) is generated based on a multi-bit frequency resolution control signal having at least one periodic pulse having a variable duty. For example, the multi-bit frequency resolution control signal includes four bits N3, N2, N1 and N0. Next, in step S703, a voltage controlled oscillating frequency signal ($f_{VCO}$) is divided based on the random digital code (SDM_OUT), and a divided voltage-controlled oscillating frequency signal ($f'_{VCO}$) is generated.

In step S705, a phase difference and a frequency difference between a reference frequency signal (fref) and the divided voltage-controlled oscillating frequency signal ($f'_{VCO}$) are detected.

Next, in step S707, charges pumped corresponding to the magnitude and sense of the output of the detecting step S705.

In step S709, the low frequency component(s) of the output of the charging or pumping step S707 are filtered.

In step S711, the voltage-controlled oscillating frequency signal ($f_{VCO}$) is generated (e.g., by a voltage-controlled oscillator) based on the filtered output of step S709 (filtering the output of step S707). The voltage-controlled oscillating frequency signal ($f_{VCO}$) a variable output frequency signal that can support a multi-band.

A fractional part of a divisor N of a fractional-N frequency synthesizer is effectively varied depending upon the duty cycle Q/P of the at least one periodic pulse of the multi-bit frequency resolution control signal, and the random digital code for varying the frequency resolution of the output frequency signal is generated.

In the frequency synthesizer according to the exemplary embodiments, the frequency resolution of the output frequency of the frequency synthesizer may be varied (e.g., increased) (depending on the average of multi-bits corresponding to periodic pulses having varying duty cycle) without increasing the number of input bits of the sigma-delta modulator. Thus, a core size of the sigma-delta modulator may be reduced, and the frequency resolution of the output frequency of the frequency synthesizer may be enhanced.

While the exemplary embodiments of the present invention have been described in detail, it should be understood that various changes, substitutions and alterations may be made herein without departing from the scope of the invention.

What is claimed is:

1. An apparatus for performing sigma-delta modulation comprising:
   a sigma-delta modulator configured to configured to receive and sigma-delta modulate an I-bit input signal and to generate digital code therefrom, wherein I is an integer greater than one, wherein the I-bit input signal comprises a most significant bit (MSB) and a least significant bit (LSB);
   wherein at least one bit of the I-bit signal has a series of pulses having a variable period P and a variable duty cycle.

2. The apparatus of claim 1, wherein the MSB of the I-bit input signal has a series of pulses having a variable period P and a variable duty cycle.

3. The apparatus of claim 1, wherein the I-bit signal is a frequency resolution control signal for a frequency synthesizer that outputs an output frequency signal being generated based on the digital code wherein the frequency resolution of the output frequency signal is varied based on the ratio of the pulse width to the period P, of the at least one bit of the I-bit signal having a series of pulses.

4. The apparatus of claim 3, wherein the frequency resolution control signal includes a binary digital code that determines the frequency resolution of the output frequency signal, and wherein the output frequency signal has a first frequency resolution when the MSB of the frequency resolution control signal has a first ratio, and has a second frequency resolution when the MSB of the frequency resolution control signal has a second ratio.

5. The apparatus of claim 1, wherein an average of the I-bits over time corresponds to an average of the digital code.

6. The apparatus of claim 1, wherein the sigma-delta modulator includes:
a plurality of modulator stages, each stage having a predetermined feedback coefficient, configured to perform sigma-delta modulation of one bit of the I-bit signal;
an overflow detector configured to detect an overflow of an output of the modulator; and
a quantizer configured to feedback the output of the sigma-delta modulator to the predetermined feedback coefficients, and configured to output the digital code.

7. A frequency synthesizer comprising:
a sigma-delta modulator configured to generate a random digital code based on sigma-delta modulating an I-bit frequency resolution control signal, wherein the most significant bit MSB of the I-bit frequency resolution control signal has a series of pulses, having a variable period P and a variable duty cycle;
a frequency divider configured to divide a voltage controlled oscillating frequency signal, based on the random digital code;
a phase frequency detector configured to detect a phase difference and a frequency difference between a reference frequency signal and the divided voltage controlled oscillating frequency signal;
a charge pump configured to pump charges corresponding to an output of the phase frequency detector;
a loop filter configured to filter a low frequency component of an output of the charge pump; and
a voltage controlled oscillator configured to generate the voltage controlled oscillating frequency signal based on an output of the loop filter.

8. The frequency synthesizer of claim 7, wherein a frequency resolution of the voltage controlled output frequency signal is varied based on the ratio of the pulse width to the period P.

9. The frequency synthesizer of claim 8, wherein the frequency resolution control signal includes I-bits having a binary digital value that determines the frequency resolution of the output frequency signal, and having a first frequency resolution of the output frequency signal when the frequency resolution control signal includes at least one pulse, and having a second frequency resolution of the output frequency signal when the frequency resolution control signal includes the I-bits having a second binary digital value corresponding to a DC (Direct Current) level.

10. The frequency synthesizer of claim 9, wherein an average of the I-bits corresponding to the at least one pulse of the frequency resolution control signal corresponds to an average of the random digital code.

11. The frequency synthesizer of claim 10, wherein the sigma-delta modulator includes:
a plurality of modulator stages having a plurality of feedback coefficients and configured to perform the sigma-delta modulation of the frequency resolution control signal;
an overflow detector configured to detect an overflow of an output of the modulator; and
a quantizer configured to feedback the output of the modulator to the a plurality of modulator stages through the predetermined feedback coefficients, and configured to output the random digital code.

12. The frequency synthesizer of claim 10, further comprising:
a pulse generator configured to generate a I-bit frequency resolution control signal having at least one pulse, the at least one pulse having a period of P and a variable duty cycle, a pulse width of the at least one pulse varying based on a pulse width control signal, and the period P varying based on a period control signal; and
a frequency multiplier configured to multiply the voltage controlled oscillating frequency signal by a plurality of multiply factors, to generate the output frequency signal.

13. The frequency synthesizer of claim 7, further comprising a pulse generator configured to vary a pulse width of a pulse corresponding to each bit of the I-bit frequency resolution control signal based on a pulse generating control signal that controls the pulse width of the at least one pulse and the period of the at least one pulse, wherein a frequency of the multi-band output frequency signal is shifted by a predetermined frequency based on an average of the I-bits corresponding to the at least one pulse of the frequency resolution control signal.

14. A fractional-N frequency synthesizing method comprising:
generating a random digital code based on sigma-delta modulating a I-bit frequency resolution control signal, wherein I is an integer greater than one, wherein the I-bit input signal comprises a most significant bit (MSB) and a least significant bit (LSB) wherein at least one bit of the I-bit frequency resolution control signal has a plurality of pulses and a period of P and a variable duty cycle;
dividing a voltage controlled oscillating frequency signal based on the random digital code;
detecting a phase difference and a frequency difference between a reference frequency signal and the divided voltage controlled oscillating frequency signal;
pumping charges corresponding to an output of the detecting step;
filtering a low frequency component of an output of the pumping step; and
generating the voltage controlled oscillating frequency signal based on an output of the filtering step.

15. The fractional-N frequency synthesizing method of claim 14, wherein a frequency resolution of the output frequency signal is varied based on the ratio of a pulse width to the period P of the at least one bit of the I-bit frequency resolution control signal.

16. The fractional-N frequency synthesizing method of claim 14, further comprising varying the pulse width of the at least one bit of the of the I-bit frequency resolution control signal based on a pulse generating control signal that controls the pulse width and the period of the at least one bit of the I-bit frequency resolution control signal, wherein a frequency of the output frequency signal is shifted by a predetermined frequency based on the period and pulse width of the at least one bit of the I-bit frequency resolution control signal.

17. The fractional-N frequency synthesizing method of claim 14, wherein the frequency resolution of the output frequency signal is variable by varying period and duty cycle of the at least one bit of the I-bit frequency resolution control signal.

18. The fractional-N frequency synthesizing method of claim 14, wherein the I-bit frequency resolution control signal comprises at least one pulse corresponding to four bits of the multi-bit frequency resolution control signal.

19. The apparatus of claim 2, wherein a second bit of the I-bit input signal has a series of pulses having a second variable period P and a second variable duty cycle.

20. The apparatus of claim 1, wherein the pulse width of the series of pulses of each bit of the I-bit signal is independently variable based on bit of a pulse width control signal and its period P is independently variable based on a bit of a period control signal.

* * * * *